(12) United States Patent
Devulapalli

(10) Patent No.: US 9,007,824 B2
(45) Date of Patent: Apr. 14, 2015

(54) BOOSTING MEMORY READS

(75) Inventor: Sridhar Devulapalli, Colorado Springs, CO (US)

(73) Assignee: Atmel Corporation, San Jose, CA (US)

(*) Notice: Subject to any disclaimer, the term of this patent is extended or adjusted under 35 U.S.C. 154(b) by 109 days.

(21) Appl. No.: 13/415,916

(22) Filed: Mar. 9, 2012

(65) Prior Publication Data

US 2013/0235679 A1 Sep. 12, 2013

(51) Int. Cl.
*G11C 8/08* (2006.01)
*G11C 16/08* (2006.01)

(52) U.S. Cl.
CPC . *G11C 8/08* (2013.01); *G11C 16/08* (2013.01)

(58) Field of Classification Search
CPC .......................................................... G11C 8/08
USPC ................................................... 365/189.011
See application file for complete search history.

(56) References Cited

U.S. PATENT DOCUMENTS

| 6,285,593 | B1* | 9/2001 | Wong | 365/185.23 |
| 2002/0012271 | A1* | 1/2002 | Forbes | 365/185.14 |
| 2002/0190730 | A1* | 12/2002 | Nitta et al. | 324/678 |
| 2004/0228192 | A1* | 11/2004 | Tedrow et al. | 365/202 |
| 2005/0017929 | A1* | 1/2005 | Sano et al. | 345/76 |
| 2006/0290381 | A1* | 12/2006 | Bui et al. | 326/91 |
| 2010/0061175 | A1* | 3/2010 | Kim | 365/226 |
| 2011/0080792 | A1* | 4/2011 | Nazarian et al. | 365/185.33 |
| 2013/0094308 | A1* | 4/2013 | Yang et al. | 365/191 |

* cited by examiner

*Primary Examiner* — Hoai V Ho
*Assistant Examiner* — Min Huang
(74) *Attorney, Agent, or Firm* — Fish & Richardson P.C.

(57) ABSTRACT

A memory device comprises memory elements that are arranged in an array. The array includes rows associated with wordlines and columns associated with bitlines. The memory elements in a row share a wordline and memory elements in a column share a bitline. For each wordline, a wordline driver circuit is associated with the wordline. The memory device comprises a boost circuit that has an output coupled to the wordline driver circuits. The boost circuit is configured to provide a negative voltage to the wordlines during a read operation of the memory device such that unselected wordlines are held at a negative voltage below a ground potential while a selected wordline is held at a supply voltage during the read operation.

31 Claims, 4 Drawing Sheets

US 9,007,824 B2

BOOSTING MEMORY READS

TECHNICAL FIELD

This disclosure relates generally to read operations in memory devices.

BACKGROUND

A memory device generally includes memory elements arranged in an array, with memory elements in a row sharing the same wordline, while memory elements in a column share the same bitline. During a memory read, a selected wordline is held at the supply voltage, while unselected wordlines are grounded.

SUMMARY

In one aspect, a memory device comprises memory elements that are arranged in an array. The array includes rows associated with wordlines and columns associated with bitlines. The memory elements in a row share a wordline and memory elements in a column share a bitline. For each wordline, a wordline driver circuit is associated with the wordline. The memory device comprises a boost circuit that has an output coupled to the wordline driver circuits. The boost circuit is configured to provide a negative voltage to the wordlines during a read operation of the memory device such that unselected wordlines are held at a negative voltage below a ground potential while a selected wordline is held at a supply voltage during the read operation.

Particular implementations of the memory device may include one or more of the following features. An output of the boost circuit may be held at a ground potential when the memory device is not performing a read operation.

The boost circuit may be configured to provide the negative voltage such that a leakage current associated with the unselected wordlines is limited to a value less than a threshold of detection by a sense amplifier. The maximum value of the negative voltage may be limited to 600 millivolts below the ground potential.

The boost circuit may be configured to provide the negative voltage for a short duration of time. The short duration of time may be in an order of nanoseconds.

The memory device may include a read-only memory (ROM). The memory device may include an electrically erasable programmable read-only memory (EEPROM). The memory device may include a random access memory (RAM).

The boost circuit may comprise a transistor, a capacitor and an inverter. The transistor may be an N-channel transistor. An output of the inverter may be coupled to a gate terminal of the transistor and a first plate of the capacitor. A second plate of the capacitor may be coupled to a drain terminal of the transistor.

The first plate of the capacitor may be held at the supply voltage while the second plate of the capacitor may be held at the ground potential when the memory device is not performing a read operation. The first plate of the capacitor may go to the ground potential when the memory device performs a read operation such that an output voltage of the boost circuit goes to the negative voltage below the ground potential.

The value of the negative voltage may be based on a size of the capacitor. The size of the capacitor may be based on a capacitive load associated with the wordlines at the output of the boost circuit. The value of the negative voltage may be based on charge sharing between the capacitor and a capacitive load associated with the wordlines at the output of the boost circuit.

In another aspect, a memory device comprises memory elements that are arranged in an array. The array includes rows associated with wordlines and columns associated with bitlines. Memory elements in a row share a wordline and memory elements in a column share a bitline. For each wordline, a wordline driver circuit is associated with the wordline. The memory device comprises a boost circuit that has an output coupled to the wordline driver circuits. The boost circuit comprising an inverter, a transistor and a capacitor. An output of the inverter is coupled to a gate terminal of the transistor and a first plate of the capacitor. A second plate of the capacitor is coupled to a drain terminal of the transistor. An input of the inverter is controllable by a signal associated with a read operation of the memory device.

Particular implementations of the memory device may include one or more of the following features. The transistor may be an N-channel transistor. The boost circuit may be configured to provide, during a read operation of the memory device, a negative voltage below a ground potential at the output of the boost circuit coupled to the wordlines such that unselected wordlines are held at the negative voltage while a selected wordline is held at a supply voltage during the read operation. The boost circuit may be configured to provide the negative voltage such that a leakage current associated with the unselected wordlines is limited to a value less than a threshold of detection by a sense amplifier.

A value of the negative voltage may be based on a size of the capacitor. The size of the capacitor may be based on a capacitive load associated with the wordlines at the output of the boost circuit.

Particular implementations of a memory device comprising a boost circuit for providing a negative voltage during memory read operations have one or more of the following advantages: (i) the size of memory arrays may be made larger; (ii) the size of memory elements in a memory array may be made smaller due to shorter channel lengths; (iii) memory devices may be designed that are able to withstand larger leakage currents in a technology; (iv) the density of memory arrays may be increased; (v) sense amplifiers may be designed with larger threshold of sensing; and (vi) speed of memory read operations may be increased due to faster sensing.

The details of one or more disclosed implementations are set forth in the accompanying drawings and the description below. Other features, aspects, and advantages will become apparent from the description, the drawings and the claims.

DETAILED DESCRIPTION

Figure 1:
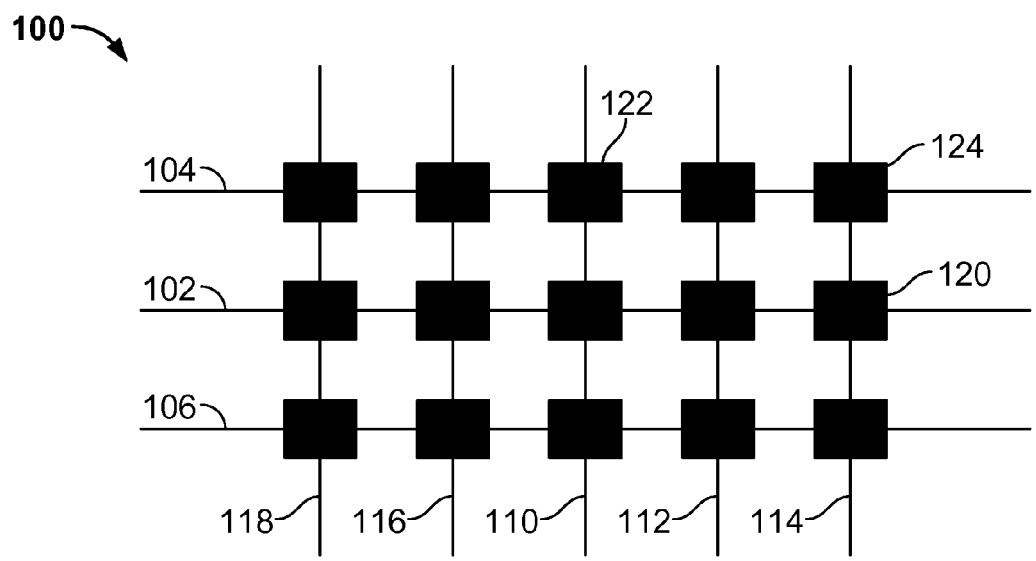
FIG. 1 is a conceptual block diagram of an exemplary memory array.

FIG. 1 is a conceptual block diagram of an exemplary memory array 100. The memory array 100 is representative of a segment of a memory device that includes a number of memory elements 120, 122 and 124. The memory elements may be arranged in rows and columns forming the memory array 100, with a certain number of memory elements per row and another number of memory elements per column. The memory elements in a row share a wordline, e.g., 102, 104 or 106, while the memory elements in a column share a bitline, e.g., 110, 112, 114, 116 or 118.

The memory device including the memory array 100 may be any appropriate memory device. For example, the memory device may be a read-only memory (ROM), including various types of a ROM such as an electrically erasable programmable read-only memory (EEPROM). The memory device also may be a random access memory (RAM), including various types of RAM, or any other suitable memory device.

In one configuration, the memory array 100 is a two-dimensional array of M×N memory elements, where M and N have integral values, e.g., 512 or 1024. The memory array 100 stores information at the level of a binary digit (bit). Any information saved to the memory device is stored in binary representation of the information in the memory array 100 and similar segments of the memory device, with each memory element in the array storing a particular bit value. A bit value may be written to a memory element, or a bit value stored in a memory element may be accessed, by specifying the row number and the column number corresponding to the memory element in the memory array. The intersection point of the specified row-column pair is the addressed memory element.

In one implementation, each memory element, e.g., 120, 122 or 124, includes a transistor device that stores a charge representative of the bit value stored in the memory element. In some other implementations, each memory element (e.g., 120, 122 or 124) includes multiple transistor devices that together store a charge representative of the bit value stored in the memory element. Although only a few memory elements 120, 122 and 124 are indicated, the memory array 100 may include a greater number of memory elements. For example, a 1024×1024 memory array includes 1048576 memory elements.

The rows in a memory array are referred to as wordlines, whereas the columns in a memory array are referred to as bitlines. For example, the wordlines 102, 104 and 106 correspond to rows of the memory array 100, while the bitlines 110, 112, 114, 116 and 118 correspond to columns of the memory array 100.

In one implementation, a wordline includes an electrical connection that is coupled to all the memory elements in the corresponding row. Generally, the wordline is connected to the gate terminals of transistors included in the memory elements in the corresponding row. For example, wordline 102 is connected to the gate terminal of the transistor in memory element 120, while wordline 104 is connected to the gate terminals of the transistors in memory elements 122 and 124. A wordline may be selected or unselected, i.e., activated or deactivated respectively, by applying a voltage to the wordline. Based on a wordline being activated or deactivated, all the transistors included in the memory elements in the row corresponding to the wordline will open or close. When a wordline is selected, all memory elements in the corresponding row may be accessed for reading or writing.

A wordline driver circuit is coupled to each wordline. When a wordline is selected or unselected, the corresponding wordline driver circuit is used to activate or deactivate the wordline by raising or lowering the voltage applied to the wordline.

In one implementation, a bitline includes a metallic stripe perpendicular to the wordlines that is connected to the source or drain terminals of the transistors included in the memory elements in the corresponding column. For example, bitline 110 is connected to the source or drain terminal of the transistor in memory element 122, while bitline 114 is connected to the source or drain terminals of the transistors in memory elements 120 and 124.

Information in the form of bit values are written to or read from the memory elements through the bitlines. While a bitline is connected to all the memory elements in the corresponding column, at a given time a single memory element in the column may be active for reading or writing. The memory element that is active in the column corresponds to the selected wordline. Each active memory element in the row associated with the selected wordline may be accessed by separate bitlines associated with the corresponding columns of the memory array. For example, when wordline 104 is selected, bitline 110 may read from or write to memory element 122, while bitline 114 may read from or write to memory element 124. In this case, the other wordlines 102 and 106 are unselected, such that bitline 114 may not read from or write to memory element 120.

A sense amplifier is coupled to each bitline and is used to write to or read from the memory elements in the column corresponding to the bitline. In one implementation, a sense amplifier connected to a bitline is configured to detect a change in the voltage or current associated with the bitline. Based on the amount of change in the voltage or current, the sense amplifier produces a '0' bit value or a '1' bit value at the output. The output bit value represents the value corresponding to the selected memory element in the bitline.

Figure 2A:
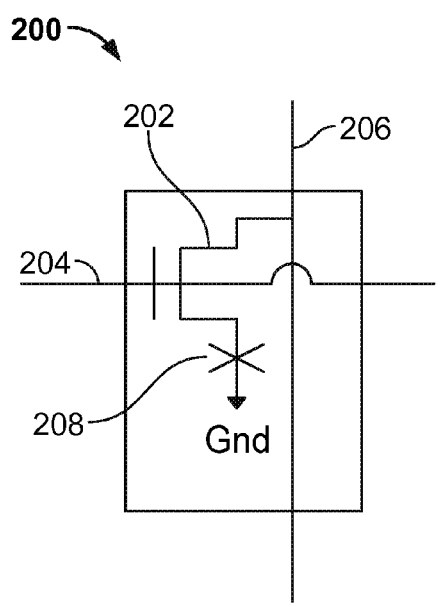
FIGS. 2A and 2B are conceptual block diagrams of exemplary memory elements in a memory array.
Figure 2B:
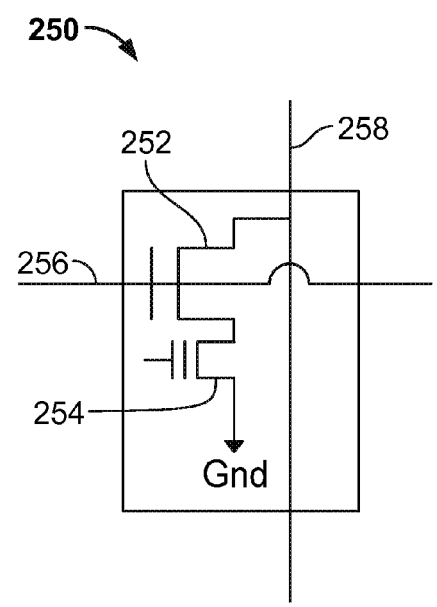

FIGS. 2A and 2B are conceptual block diagrams of exemplary memory elements, 200 and 250 respectively, in a memory array. Memory elements 200 or 250 may be, for example, memory elements 120, 122 or 124 in memory array 100. All the memory elements in the memory array 100 are of the same type, such that memory elements 120, 122 and 124 may be similar to either memory element 200 or memory element 250, but not both. The following describes the memory elements 200 and 250 as being implemented in the memory array 100. However, the memory elements 200 and 250 may be implemented by other memory array configurations.

Memory element 200 illustrated in FIG. 2A is an example of a memory element in a ROM device. The memory element 200 includes a transistor 202, and the memory element 200 is coupled to a wordline 204 and bitline 206.

In one example, the transistor 202 is an N-channel transistor. The source terminal 208 of the transistor 202 is held at a ground potential once the memory element 200 is programmed. The gate terminal of the transistor 202 is connected to the wordline 204, while the drain terminal is connected to the bitline 206. Since memory element 200 is a ROM element, when the memory element is programmed, the potential across the transistor 202 is set to a fixed value. The value stored in the memory element 200 may be read using the wordline 204 and the bitline 206, but the stored value may not be overwritten.

Memory element 250 illustrated in FIG. 2B is an example of a memory element in an EEPROM device. The memory element 250 is coupled to a wordline 256 and bitline 258. The memory element 250 includes a select transistor 252 and a floating gate transistor 254.

The source terminal of the select transistor 252 is connected to the drain terminal of the floating gate transistor 254. The gate terminal of the select transistor 252 is connected to the wordline 256, while the drain terminal is connected to the bitline 258. The source terminal of the floating gate transistor 254 is held at a ground potential. The memory element 250 may be read from or written to using the wordline 254 and the bitline 258.

As described previously, during a read operation of a memory array, a wordline is selected and the values stored in the memory elements connected to the selected wordline are read using bitlines. In one implementation, the selected wordline is held at the supply voltage while the other wordlines, which are unselected, are grounded. For example, in a memory array of M wordlines, one wordline is selected while the remaining M-1 wordlines are unselected. Sense amplifiers connected to the bitlines are used to sense the voltage or current in the memory elements corresponding to the selected wordline.

In order that a sense amplifier may accurately sense the voltage or current in the memory element corresponding to the selected wordline, there should be no leakage current or voltage due to the M-1 unselected memory elements hanging off the same bitline. However, in several implementations, a leakage current or voltage is present in the unselected memory elements. For example, in newer technologies, a memory device may pack a very large number of memory elements in a very small size of the memory device. This may be achieved using memory elements with shorter gate lengths. However, due to the short gate lengths, the leakage across the memory elements may increasing significantly.

The leakage may interfere with the accurate sensing of selected memory elements during a read operation. For example, in a memory array with 1024 memory elements per bitline, each unselected or "off" memory element may conduct or leak a few nano-amperes of current. The leakage may be insignificant for an individual memory element, but the combined leakage due to the 1023 unselected memory elements in a bitline may be in the range of a few microamperes ($\mu$As). For the selected memory element, a sensed current of 10 $\mu$As may represent a '0' bit value, while a current of 1 $\mu$A may represent a '1' bit value. The sense amplifier connected to the bitline may be configured to determine the bit value stored in the selected memory element by sensing the current on the corresponding bitline. Therefore, for correct determination, when a '1' bit value is stored in the selected memory element, the sense amplifier should sense a current approximately equal to 1 $\mu$A on the bitline. However, due to the leakage associated with the unselected memory elements, the sense amplifier may read a combined current approaching 10 $\mu$As on the bitline. Consequently, the sense amplifier may incorrectly determine that a '0' bit value is stored in the selected memory element.

In some implementations, large memory arrays are broken up into multiple smaller sectors or wordline stacks to address the issue of leakage associated with unselected memory elements. However, such implementations may increase complexity of the memory devices. Such implementations also may increase the size of the memory devices.

In some implementations, sense amplifiers with fine-grained sensing capabilities may be used to read correctly memory element values in the presence of leakage. The "sensing point" or threshold current value between a '0' and a '1' determination may vary in sense amplifiers due to construction issues, even if the threshold is set at a fixed value. The variation in the sensing point may be accommodated by using a range as the threshold, e.g., for a sensing point set at 5 $\mu$As, the range may be set between 4.5 $\mu$As and 5.5 $\mu$As. To address the leakage issue, a tight "trip" point with a narrow threshold range may be used. However, such narrow threshold range may be difficult to achieve in construction of sense amplifiers.

In some other implementations, memory elements with larger gate length devices may be used to mitigate the effect of leakage. However, larger gate length devices may increase the area of the memory arrays.

In one implementation, the issue due to leakage of unselected memory elements may be addressed by holding the unselected wordlines at a potential of a few hundred millivolts (mVs) below ground during a read operation. Consequently, the gate-source potential $V_{gs}$ of the memory elements corresponding to the unselected wordlines will be negative, thereby reducing overall bitline leakage by several orders of magnitude.

Figure 3:
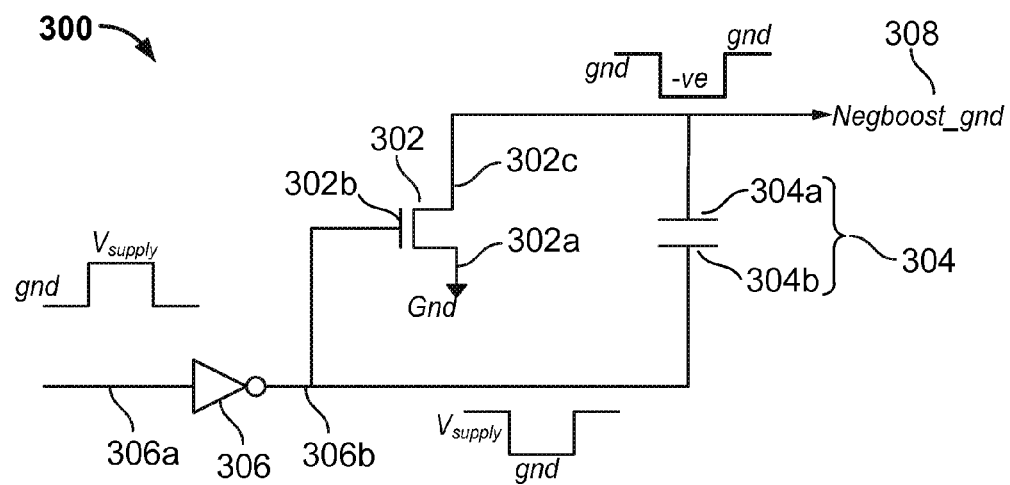
FIG. 3 is a conceptual block diagram of an exemplary boost circuit for providing a negative voltage.

FIG. 3 is a conceptual block diagram of an exemplary boost circuit 300 for providing a negative voltage. The boost circuit 300 is an example of a circuit that may be used in conjunction with memory array 100 to provide a negative voltage boost to the unselected wordlines during a read operation. The following describes the boost circuit 300 as being implemented by the memory array 100. However, the boost circuit 300 may be implemented by other systems or system configurations.

The boost circuit 300 includes an N-channel transistor 302, a capacitor 304 and an inverter 306. A voltage Negboost_gnd is provided at the output 308 of the boost circuit 300. The source terminal 302a of the N-channel transistor is held at ground potential. The gate terminal 302b of the N-channel transistor is coupled to the output 306b of the inverter. The drain terminal 302c of the N-channel transistor is coupled to the top plate 304a of the capacitor, and to the output 308 of the boost circuit 300. The bottom plate 304b of the capacitor is coupled to the output 306b of the inverter. A signal is applied to the input 306a of the inverter during memory read operations.

In one implementation, when the memory array 100 is not performing a read operation, the voltage at the input 306a of the inverter 306 is at ground potential, while the voltage at the output 306b of the inverter is at the supply voltage $V_{supply}$. Therefore, the potential applied to the gate terminal 302b of the transistor 302 and the bottom plate 304b of the capacitor is $V_{supply}$. Due to the $V_{supply}$ voltage at the gate terminal 302b, the N-channel transistor 302 is turned on such that the potential at the drain terminal 302c is same as the potential at the source terminal, i.e., ground potential. In this circumstance, the top plate 304a of the capacitor 304 is shorted to ground potential through the N-channel transistor 302 and the voltage Negboost_gnd is held at ground potential. In this situation, the capacitor 304 has a voltage across its plates, where the bottom plate is at the supply voltage $V_{supply}$, while the top plate is at ground potential.

When the memory array 100 performs a read operation, a high voltage (e.g., $V_{supply}$) is applied to the input 306a of the inverter 306. The voltage at the output 306b of the inverter is low (e.g., ground potential) and so the voltage at the gate terminal 302b of the transistor 302 is at ground potential, thereby turning the N-channel transistor off. In this situation, the top plate 304a of the capacitor floats and is no longer shorted to ground. However, due to the ground potential at the output 306b, the potential at the bottom plate 304b of the capacitor changes from $V_{supply}$ to ground potential. This transition at the bottom plate 304b happens quickly due to the quick transition of the inverter gate input signal from ground potential to $V_{supply}$.

The top plate 304a of the capacitor 304 attempts to follow the change in voltage of the bottom plate 304b. Since the voltage at the bottom plate reduced by an amount similar to $V_{supply}$ (the bottom plate 304b transitions from $V_{supply}$ voltage to ground potential), the top plate 304a also tries to reduce by an amount of $V_{supply}$ voltage. Consequently, the voltage at the top plate 304a of the capacitor transitions from ground potential to a voltage approaching $-V_{supply}$. The change in voltage at the top plate of the capacitor takes the voltage Negboost_gnd at the output 308 to a negative voltage below ground.

While the voltage at the top plate 304a of the capacitor 304 attempts to decrease from ground potential to $-V_{supply}$, the voltage does not reach $-V_{supply}$ value. Instead, the reduction in voltage at the top plate 304a is less than $-V_{supply}$. This may be due to, for example, charge sharing between the capacitor 304 and the capacitive load of the device to which the boost circuit 300 is connected. The size of the capacitor 304 also may determine the amount of reduction in voltage of the top plate 304a, i.e., how negative the output voltage Negboost_gnd will go. In some implementations, the size of the capacitor 304 may be chosen based on the capacitive load seen at the output 308 due to the connected memory array 100. For example, for a given negative output voltage Negboost_gnd, the size of the capacitor 304 would be larger when coupled to a larger memory array 100, compared to the case when the capacitor 304 is coupled to a smaller memory array 100. In some implementations, the negative voltage Negboost_gnd is limited to approximately 600 mV below ground potential, beyond which the source substrate diodes associated with the memory elements may be forward biased.

Figure 4:
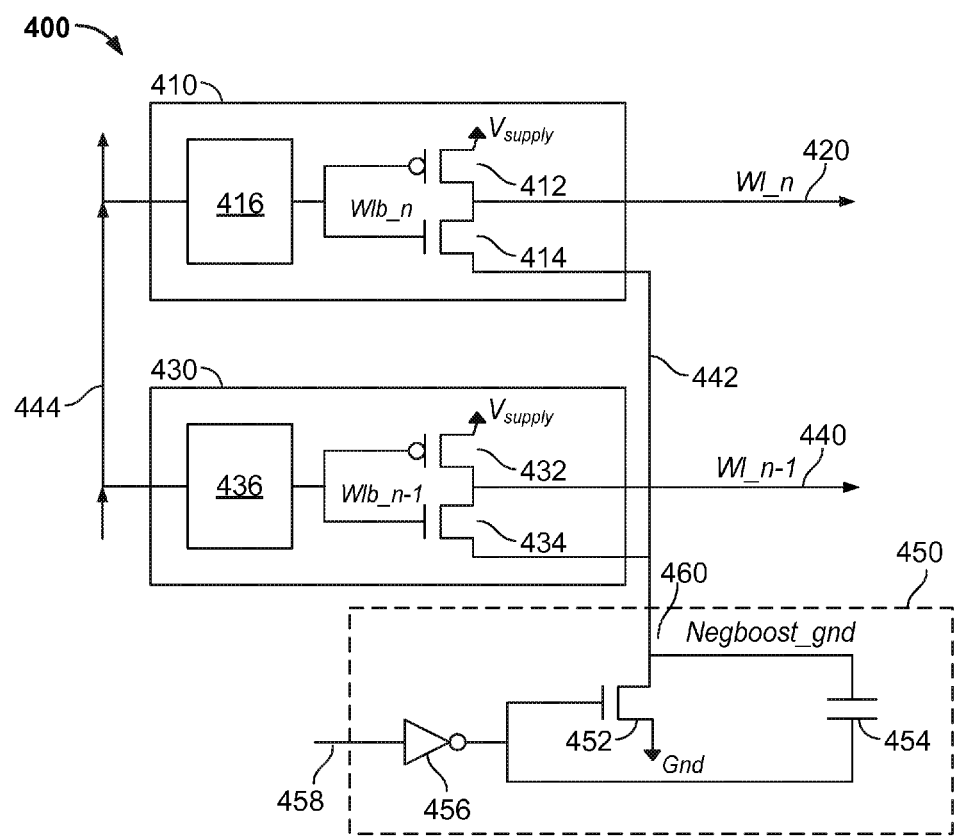
FIG. 4 is conceptual block diagram of an exemplary memory device that includes a boost circuit for providing a negative voltage to wordline drivers during memory read operations.

FIG. 4 is conceptual block diagram of an exemplary memory device 400 that includes a boost circuit for providing a negative voltage to wordline drivers during memory read operations. The memory device 400 may be similar to a memory device that includes the memory array 100 coupled to the boost circuit 300.

The memory device 400 includes wordline driver circuits 410 and 430 that are connected to wordlines Wl_n 420 and Wl_n-1 440 respectively. The wordline driver circuits are coupled to boost circuit 450. The connection 444 provides an input to the wordline driver circuits.

The wordlines Wl_n 420 and Wl_n-1 440 are similar to the wordlines 102, 104 or 106. Each of Wl_n 420 and Wl_n-1 440 is connected to a plurality of memory elements that are similar to memory elements 120, 122 and 124. Although only two wordlines are shown in FIG. 4, the memory device 400 may include many more wordlines, e.g., 512 or 1024 wordlines, with each wordline being connected to a wordline driver circuit.

The wordline driver circuit 410 includes a P-channel transistor 412, an N-channel transistor 414 and a decoder circuit 416. The P-channel transistor and the N-channel transistor together form an inverter or buffer in the driver circuit 410 for driving the wordline 420. The source terminal of the P-channel transistor 412 is connected to the supply voltage $V_{supply}$, while the source terminal of the N-channel transistor 414 is connected to the output voltage Negboost_gnd of the boost circuit 450 through the connection 442. The gate terminals of the transistors 412 and 414 are coupled to the output of the decoder circuit 416, which provides a voltage Wlb_n to the gate terminals of the transistors 412 and 414. The drain terminals of the transistors 412 and 414 are shorted together and they drive the wordline Wl_n 420.

Configured similar to the wordline driver circuit 410, the wordline driver circuit 430 includes a P-channel transistor 432, an N-channel transistor 434 and a decoder circuit 436. The source terminal of the transistor 432 is connected to the supply voltage $V_{supply}$, while the source terminal of the transistor 434 is connected to the output voltage Negboost_gnd of the boost circuit 450 through the connection 442. The gate terminals of the transistors 432 and 434 are coupled to the output of the decoder circuit 436, which provides a voltage Wlb_n-1 to the gate terminals of the transistors 432 and 434. The drain terminals of the transistors 432 and 434 are shorted together and they drive the wordline Wl_n-1 440.

The boost circuit 450 is similar to the boost circuit 300 and includes an N-channel transistor 452, a capacitor 454 and an inverter 456. A read signal is applied to the inverter 456 at the input 458 of the boost circuit 450 during read operations of the memory device 400. The output of the inverter is coupled to the gate terminal of the transistor 452 and the bottom plate of the capacitor 454. The drain terminal of the transistor 452 and the top plate of the capacitor 454 are coupled together and provide the voltage Negboost_gnd at the output 460 of the boost circuit 450. The source terminal of the transistor 452 is held at ground potential.

The connection 444 provides addresses of memory elements to the decoder circuits 416 and 436. In some implementations, the addresses may be provided as encoded addresses, in which case the decoder circuits 416 and 436 may be configured to decode the encoded input and determine the selected memory addresses. In other implementations, the addresses may be provided as pre-decoded addresses.

Based on the memory address provided on connection 444, one of the wordlines is selected. For example, the wordline Wl_n 420 may be selected. The decoder circuit 416 of the selected wordline biases the gate terminals of the transistors 412 and 414 such that the P-channel transistor 412 is turned on and the N-channel transistor 414 is turned off. Consequently, the selected wordline Wl_n 420 is provided with the supply voltage $V_{supply}$ through the P-channel transistor 412.

The decoder circuits associated with the remaining wordlines, which are unselected, biases the gate terminals of the P-channel and N-channel transistors in the corresponding driver circuits such that the P-channel transistor is turned off and the N-channel transistor is turned on. Consequently, each unselected wordline is shorted to the voltage Negboost_gnd at the output of the boost circuit through the N-channel transistor that is coupled to the booster circuit through the connection 442. For example, Wl_n-1 440 is unselected when wordline Wl_n 420 is selected. Therefore, decoder circuit 430 biases the gate terminals of transistors 432 and 434 such that P-channel transistor 432 is turned off and N-channel transistor 434 is turned on. The potential of the wordline Wl_n-1 440 is shorted to the voltage Negboost_gnd at the output 460 of the boost circuit 450 through the connection 442.

As described previously, during a read operation of the memory device, a read signal is applied to the input 458 of the boost circuit 450 and the voltage Negboost_gnd at the output 460 goes negative, e.g., a few hundred millivolts below ground potential. Therefore, the unselected wordlines (e.g., Wl_n-1 440), which are shorted to the voltage Negboost_gnd, are boosted to a negative potential that may be a few hundred millivolts below ground potential. Consequently, a negative bias is applied to the gate terminals of the unselected memory elements corresponding to the unselected wordlines, and the leakage due to the unselected memory elements is reduced. For a bitline, the combined leakage due to the unselected memory elements corresponding to the bitline is held at a low value. Therefore, a sense amplifier associated with the bitline can read correctly the bit value stored in the selected memory element corresponding to the bitline. Therefore, the Negboost_gnd voltage generated by the boost circuit limits the leakage due to unselected memory elements and facilitates the accurate reading of the selected memory element.

In some implementations, there may be a small current increase during read operations of memory device 400 due to the boost circuit 450. This may be, for example, due to the bottom plate of the capacitor 454 drawing a small current when transitioning from the supply voltage $V_{supply}$ to the ground potential when the read signal is applied to the input 458 and the Negboost_gnd voltage at the output 460 goes negative.

As described previously, the value of the Negboost_gnd voltage applied during read operations of the memory device is affected by the charge sharing between the boost circuit 450 and the capacitive load due to the sum of the wordlines. This may influence selection of the capacitor 454 of a suitable size. Since the value of Negboost_gnd voltage applied during the read operations is based on the size of the capacitor 454, the boost circuit 450 may be configured such that memory values can be read properly even in cases where leakage may be much higher in the memory device 400, e.g., in a memory array 100 where the boost circuit 450 is not employed. This also may enable the memory device 400 to include larger memory arrays or memory stacks.

The individual memory elements may be designed with shorter channel lengths, which may lead to smaller memory elements and thereby to smaller sizes of the memory device 400. Shorter channel lengths may produce larger leakage currents in the memory elements. The boost circuit 450 may be configured with the capacitor 454 and other components of suitable sizes to produce voltage Negboost_gnd of an amount that is sufficient to counter the larger leakage currents due to the shorter channel lengths.

In addition, by using the boost circuit 450 to reduce the leakage and thus reduce interference with the reading memory values, sense amplifiers may be designed to determine memory values over a wider voltage range without tight trip points. Therefore, fine grained detection by the sense amplifiers is not needed, and the design of the sense amplifiers may be made simpler. Furthermore, since the memory values may be determined over a wider voltage range, the sense amplifiers may be enabled to make a determination more quickly, thereby leading to faster memory sensing.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A memory device comprising:
   memory elements arranged in an array including rows associated with wordlines and columns associated with bitlines, wherein memory elements in a row share a wordline and memory elements in a column share a bitline;
   a boost circuit that is configured to read a read signal input during a read operation of the memory device and to provide a first negative voltage at an output during the read operation, wherein the boost circuit includes an inverter that is configured to read the read signal input during the read operation, wherein an output of the inverter is coupled to a gate terminal of a transistor and a first plate of a capacitor that are included in the boost circuit, and wherein the transistor and the capacitor are configured to provide the first negative voltage at the output; and
   a wordline driver circuit that includes a buffer coupled to an associated wordline, wherein the buffer is further coupled to the boost circuit and configured to receive the first negative voltage and to provide an output voltage to the associated wordline such that the associated wordline, when unselected during the read operation, is held at a second negative voltage below a ground potential based on the first negative voltage.

2. The memory device of claim 1, wherein capacitor is configured to provide the first negative voltage at the output, and wherein a size of the capacitor is configured to generate the first negative voltage of a predetermined value that is operable to limit an aggregate leakage current associated with the unselected wordline within a threshold of detection by a sense amplifier.

3. The memory device of claim 1, wherein the capacitor is configured to provide the first negative voltage at the output, and wherein a size of the capacitor is configured to generate the first negative voltage of a predetermined value that is below a breakdown voltage associated with the memory elements.

4. The memory device of claim 1, wherein the memory device is one of a read-only memory (ROM), an electrically erasable programmable read-only memory (EEPROM), or a random access memory (RAM).

5. The memory device of claim 1, wherein the transistor is configured to provide the first negative voltage at the output, and wherein the transistor includes an N-channel transistor.

6. The memory device of claim 1, wherein the boost circuit is configured to hold an input of the inverter at ground potential when the memory device is not performing a read operation, such that the first plate of the capacitor is held at a supply voltage while a second plate of the capacitor is held at ground potential when the memory device is not performing the read operation.

7. The memory device of claim 6, wherein the boost circuit is configured to enable the output of the boost circuit follow the potential associated with the first plate of the capacitor, such that the output of the boost circuit is held at ground potential when the memory device is not performing the read operation.

8. The memory device of claim 1, wherein a second plate of the capacitor goes to the negative voltage below ground potential when the memory device performs a read operation, and wherein the boost circuit is configured to enable the output to follow the potential associated with the second plate of the capacitor such that the output of the boost circuit goes to the second negative voltage below the ground potential.

9. The memory device of claim 1, wherein capacitor is configured to provide the first negative voltage at the output, and wherein a size of the capacitor is selected to generate the first negative voltage of a predetermined value that is based on a capacitive load corresponding to the wordline associated with the wordline driver circuit.

10. The memory device of claim 1, wherein the capacitor is configured to provide the first negative voltage at the output, and wherein a value of the first negative voltage is based on charge sharing between the capacitor and a capacitive load corresponding to the wordline associated with the wordline driver circuit.

11. The memory device of claim 1, wherein the boost circuit is distinct from the wordline driver circuit and is configured to provide the first negative voltage to the wordline driver circuit in response to receiving, at an input of the inverter and independent of the wordline driver circuit, the read signal during the read operation of the memory device.

12. The memory device of claim 1, wherein a source terminal of the transistor is held at ground potential.

13. The memory device of claim 1, wherein the output of the boost circuit is connected to a source terminal of a second transistor that is part of the buffer for driving an associated wordline.

14. The memory device of claim 13, wherein the second transistor comprises an N-channel transistor and the buffer includes a P-channel transistor having a source terminal connected to a supply voltage and a drain terminal shorted to a drain terminal of the N-channel transistor, and wherein voltage at the shorted drain terminals of the P-channel and N-channel transistors drive the associated wordline.

15. The memory device of claim 14, wherein the wordline driver circuit comprises a decoder circuit that includes an output coupled to gate terminals of the P-channel and N-channel transistors, and wherein the decoder circuit is operable to bias gate terminals of the P-channel and N-channel transistors upon receiving addresses of memory elements from an input to the wordline driver circuit.

16. A memory device comprising:

memory elements arranged in an array including rows associated with wordlines and columns associated with bitlines, wherein memory elements in a row share a wordline and memory elements in a column share a bitline;

for each wordline, a wordline driver circuit associated with the wordline; and a boost circuit having an output that is coupled to the wordline driver circuits, the boost circuit comprising an inverter, a transistor and a capacitor, wherein an output of the inverter is coupled to a gate terminal of the transistor and a first plate of the capacitor, while a second plate of the capacitor is coupled to a drain terminal of the transistor providing a negative voltage directly to the wordline driver circuits, and wherein an input of the inverter is controllable by a signal associated with a read operation of the memory device.

17. The memory device of claim 16, wherein the transistor is an N-channel transistor.

18. The memory device of claim 16, wherein a size of the capacitor is configured to generate the negative voltage of a predetermined value that is based on a capacitive load associated with the wordlines at the output of the boost circuit.

19. The memory device of claim 16, wherein the boost circuit is independent of the bitlines, and is configured to perform operations comprising:

receiving, during a read operation of the memory device and independent of the wordline driver circuit, a read signal; and in response to receiving the read signal, providing a negative voltage to the wordlines such that unselected wordlines are held at a negative voltage below a ground potential while a selected wordline is held at a supply voltage during the read operation.

20. The memory device of claim 19, wherein a size of the capacitor is configured to generate the negative voltage of a predetermined value that is operable to limit an aggregate leakage current associated with the unselected wordlines within a threshold of detection by a sense amplifier.

21. The memory device of claim 19, wherein the boost circuit is configured to provide a ground potential at an input of the inverter when the memory device is not performing a read operation.

22. The memory device of claim 21, wherein the boost circuit is configured such that the first plate of the capacitor is held at the supply voltage while the second plate of the capacitor is held at ground potential when the memory device is not performing the read operation.

23. The memory device of claim 22, wherein the boost circuit is configured to enable the output of the boost circuit follow the potential associated with the second plate of the capacitor, such that the output of the boost circuit is held at the ground potential when the memory device is not performing the read operation.

24. The memory device of claim 19, wherein the read signal is provided at an input of the inverter.

25. The memory device of claim 24, wherein the second plate of the capacitor goes to the negative voltage below ground potential based on receiving the read signal at the input of the inverter.

26. The memory device of claim 25, wherein the boost circuit is configured to enable the output of the boost circuit follow the potential associated with the second plate of the capacitor such that the output of the boost circuit goes to the negative voltage below the ground potential.

27. The memory device of claim 16, wherein a size of the capacitor is configured to generate the negative voltage of a predetermined value that is below a breakdown voltage associated with the memory elements.

28. The memory device of claim 16, wherein the memory device includes one of a read-only memory (ROM), an electrically erasable programmable read-only memory (EEPROM), or a random access memory (RAM).

29. The memory device of claim 16, wherein the output of the boost circuit is connected to a source terminal of a transistor included in a wordline driver circuit that is part of a buffer for driving an associated wordline.

30. The memory device of claim 29, wherein the transistor included in the wordline driver circuit comprises an N-channel transistor and the buffer includes a P-channel transistor having a source terminal connected to supply voltage and a drain terminal shorted to a drain terminal of the N-channel transistor, and wherein voltage at the shorted drain terminals of the P-channel and N-channel transistors drive the associated wordline.

31. The memory device of claim 30, wherein the wordline driver circuit comprises a decoder circuit that includes an output coupled to gate terminals of the P-channel and N-channel transistors, and wherein the decoder circuit is operable to bias gate terminals of the P-channel and N-channel transistors upon receiving addresses of memory elements from an input to the wordline driver circuit.

* * * * *

UNITED STATES PATENT AND TRADEMARK OFFICE
CERTIFICATE OF CORRECTION

PATENT NO. : 9,007,824 B2  Page 1 of 1
APPLICATION NO. : 13/415916
DATED : April 14, 2015
INVENTOR(S) : Sridhar Devulapalli It is certified that error appears in the above-identified patent and that said Letters Patent is hereby corrected as shown below:

In the Claims,

Column 10 Line 16 In Claim 2, delete "wherein" and insert -- wherein the --, therefor.

Signed and Sealed this
Eleventh Day of August, 2015

Michelle K. Lee
*Director of the United States Patent and Trademark Office*